US009288925B2

(12) United States Patent
Fu

(10) Patent No.: US 9,288,925 B2
(45) Date of Patent: Mar. 15, 2016

(54) ELECTRICAL CONNECTOR AND ELECTRONIC DEVICE HAVING THE SAME

(71) Applicant: WISTRON CORPORATION, New Taipei (TW)

(72) Inventor: Hong-Yun Fu, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 14/289,614

(22) Filed: May 28, 2014

(65) Prior Publication Data

US 2015/0131212 A1    May 14, 2015

(30) Foreign Application Priority Data

Nov. 14, 2013  (TW) .............................. 102141451 A

(51) Int. Cl.
*H05K 1/00*     (2006.01)
*H05K 5/06*     (2006.01)
*H01R 13/52*    (2006.01)

(52) U.S. Cl.
CPC ............ *H05K 5/069* (2013.01); *H01R 13/5202* (2013.01)

(58) Field of Classification Search
CPC ............ H01R 13/6658; H01R 23/025; H01R 13/658; H01R 13/5208; H02G 3/20
USPC .......... 439/76.1, 361, 587, 637; 361/736, 752
See application file for complete search history.

(56) References Cited

U.S. PATENT DOCUMENTS

| 6,034,876 | A  | * | 3/2000 | Ohno et al. ................... 361/752 |
| 6,482,021 | B2 | * | 11/2002 | Hara ................. B29C 45/14639 439/279 |
| 6,960,099 | B2 | * | 11/2005 | McAlonis .................... 439/545 |
| 7,347,723 | B1 | * | 3/2008 | Daily ........................... 439/519 |
| 8,246,383 | B2 | * | 8/2012 | Schmidt et al. .......... 439/607.35 |
| 8,491,336 | B2 |   | 7/2013 | Cocquyt et al. |
| 2008/0064260 | A1 | * | 3/2008 | Mckenzie .......... H01R 13/5208 439/587 |
| 2009/0017659 | A1 | * | 1/2009 | Yoneda .............. H01R 13/5208 439/271 |
| 2009/0174990 | A1 | * | 7/2009 | Ligtenberg et al. ...... 361/679.01 |
| 2011/0086544 | A1 | * | 4/2011 | Yoshioka et al. ............. 439/587 |

OTHER PUBLICATIONS

Office Action issued to Taiwanese Counterpart Application No. 102141451 by the Taiwan Intellectual Property Office on Jul. 6, 2015 along with an English translation of sections boxed.

* cited by examiner

*Primary Examiner* — Abdullah Riyami
*Assistant Examiner* — Thang Nguyen
(74) *Attorney, Agent, or Firm* — The Mueller Law Office, P.C.

(57) ABSTRACT

An electrical connector includes an insulation body that includes a base and a waterproof unit, and a plurality of conductive terminals. The base includes a terminal-holding portion and a board portion that has front and rear faces. The terminal-holding portion has first and second contact faces disposed outward of the front and rear faces, respectively. The waterproof unit includes a first sealing portion that protrudes from the front face and that surrounds the terminal-holding portion, and a second sealing portion that protrudes from the rear face and that is disposed along a periphery of the rear face. Each of the conductive terminals has first and second conducting portions respectively disposed on the first and second contact faces.

6 Claims, 3 Drawing Sheets

ELECTRICAL CONNECTOR AND ELECTRONIC DEVICE HAVING THE SAME

CROSS-REFERENCE TO RELATED APPLICATION

This application claims priority of Taiwanese Application No. 102141451, filed on Nov. 14, 2013.

BACKGROUND OF THE INVENTION

1. Field of the Invention

The present invention relates to an electrical connector, more particularly to an electrical connector that can be mounted in an electronic device in a watertight manner.

2. Description of the Related Art

A conventional handheld electronic device, such as a handheld food-ordering device, requires an exceptional waterproof function to prevent exposure of a circuit board of the electronic device to liquid or vapor, which may otherwise result in damage or short-circuiting of electronic components within the electronic device.

A handheld electronic device generally requires an electrical connector for transmissions of electricity for charge/discharge and a data, where a terminal of the electrical connector is required to be exposed outward of a housing of the electronic device in order to couple a mating electrical connector. Therefore, the junction between the electrical connector and the housing is required to be waterproof so as to prevent entry of liquid or vapor into the housing therethrough.

A conventional waterproof configuration for the electronic device generally utilizes an additional waterproof unit that is disposed between the electrical connector and the housing to seal a gap therebetween. However, the waterproof unit should be individually designed and manufactured to correspond to electrical connectors of different sizes, thereby increasing manufacturing time and cost.

SUMMARY OF THE INVENTION

Therefore, an object of the present invention is to provide an electrical connector formed integrally with a waterproof unit that enables watertight coupling with an electronic device to alleviate the above drawbacks of the prior art.

Accordingly, an electrical connector of the present invention includes an insulation body and a plurality of conductive terminals.

The insulation body includes a base and a waterproof unit. The base includes a board portion and a terminal-holding portion that are formed as one piece. The board portion has a front face and a rear face. The terminal-holding portion has a first contact face that is disposed outward of the front face, and a second contact face that is disposed outward of the rear face. The waterproof unit includes a first sealing portion and a second sealing portion that are made of a resilient material. The first sealing portion protrudes from the front face and surrounds the terminal-holding portion. The second sealing portion protrudes from the rear face and is disposed along a periphery of the rear face.

The conductive terminals are spacedly disposed on the terminal-holding portion. Each of the conductive terminals has a first conducting portion that is disposed on the first contact face, and a second conducting portion that is disposed on the second contact face.

Another object of the present invention is to provide an electronic device that has an electrical connector with a waterproofing structure.

According to another aspect of the present invention, an electronic device includes a housing and an electrical connector. The housing includes a main body and a cover. The electrical connector includes an insulation body and a plurality of conductive terminals.

The insulation body includes a base and a waterproof unit. The base includes a board portion and a terminal-holding portion that are formed as one piece. The board portion has a front face and a rear face. The terminal-holding portion has a first contact face that is disposed outward of the front face, and a second contact face that is disposed outward of the rear face. The waterproof unit includes a first sealing portion and a second sealing portion that are made of a resilient material. The first sealing portion protrudes from the front face and surrounds the terminal-holding portion. The second sealing portion protrudes from the rear face and is disposed along a periphery of the rear face.

The conductive terminals are spacedly disposed on the terminal-holding portion. Each of the conductive terminals has a first conducting portion that is disposed on the first contact face, and a second conducting portion that is disposed on the second contact face.

The main body has a cavity and a carrier face. The cavity receives the electrical connector therein. The carrier face is disposed in the cavity, faces the cover and supports the board portion of the insulation body. The cover covers the cavity and has a window that corresponds to the terminal-holding portion to expose the first contact face and the first conducting portions of the conductive terminals. The first sealing portion abuts watertightly against an inner side of the cover and is immediately adjacent to the window. The second sealing portion abuts watertightly against the carrier face.

BRIEF DESCRIPTION OF THE DRAWINGS

Other features and advantages of the present invention will become apparent in the following detailed description of the embodiment with reference to the accompanying drawings, of which.

DETAILED DESCRIPTION OF THE EMBODIMENT

Figure 1:
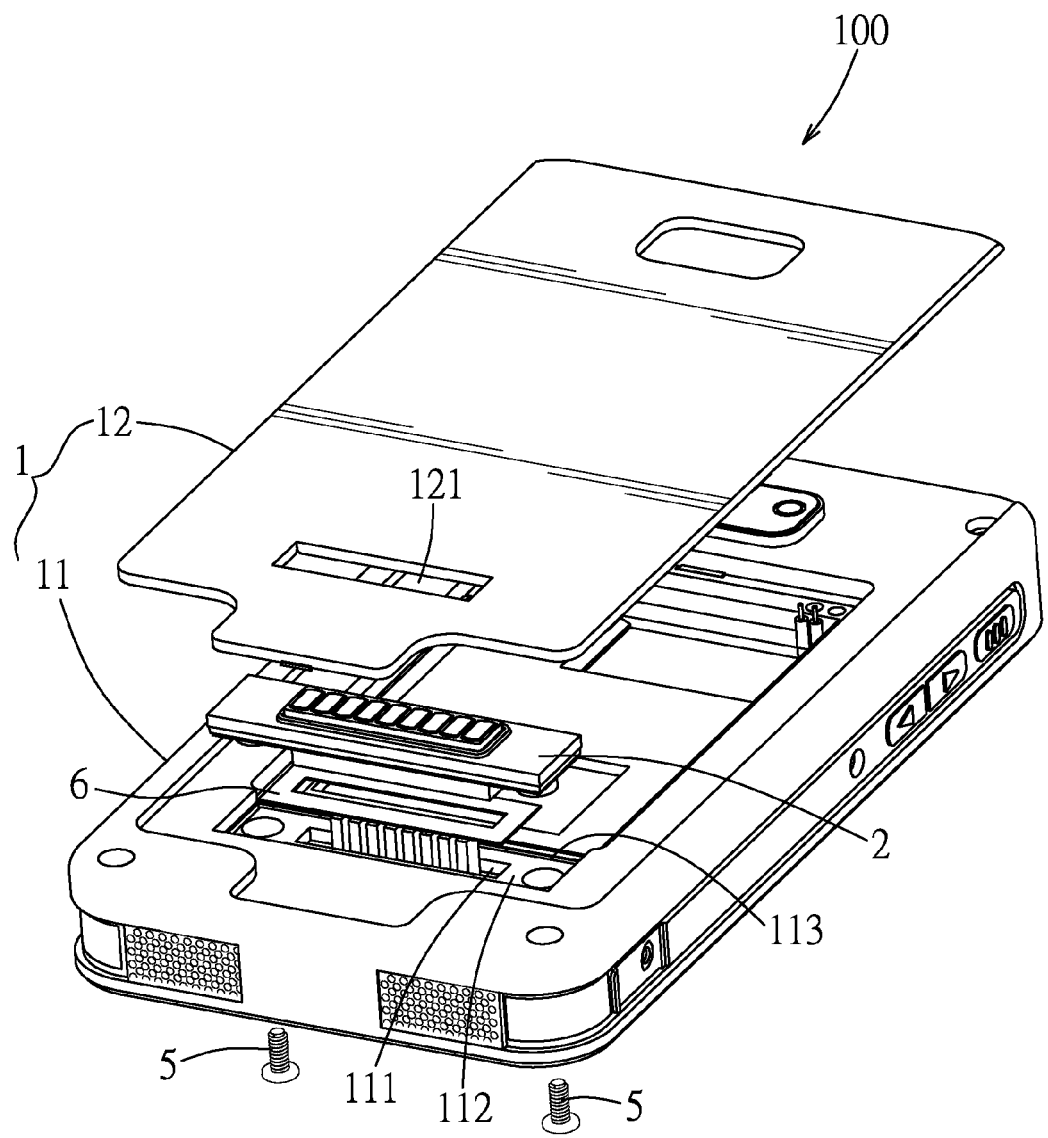
FIG. 1 is a perspective exploded view of an embodiment of an electronic device according to the present invention.
Figure 2:
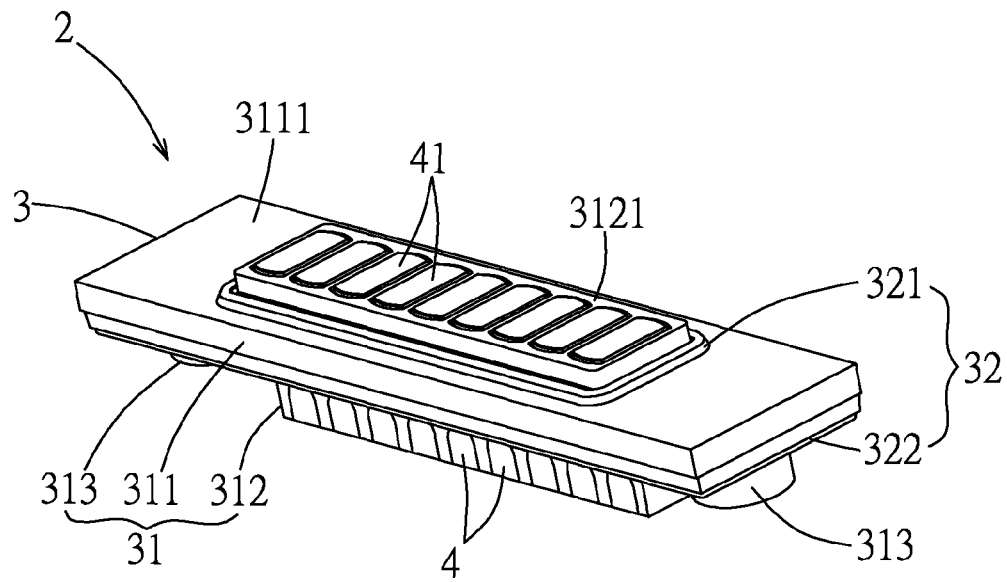
FIG. 2 is a perspective view of an electrical connector of the embodiment.
Figure 3:
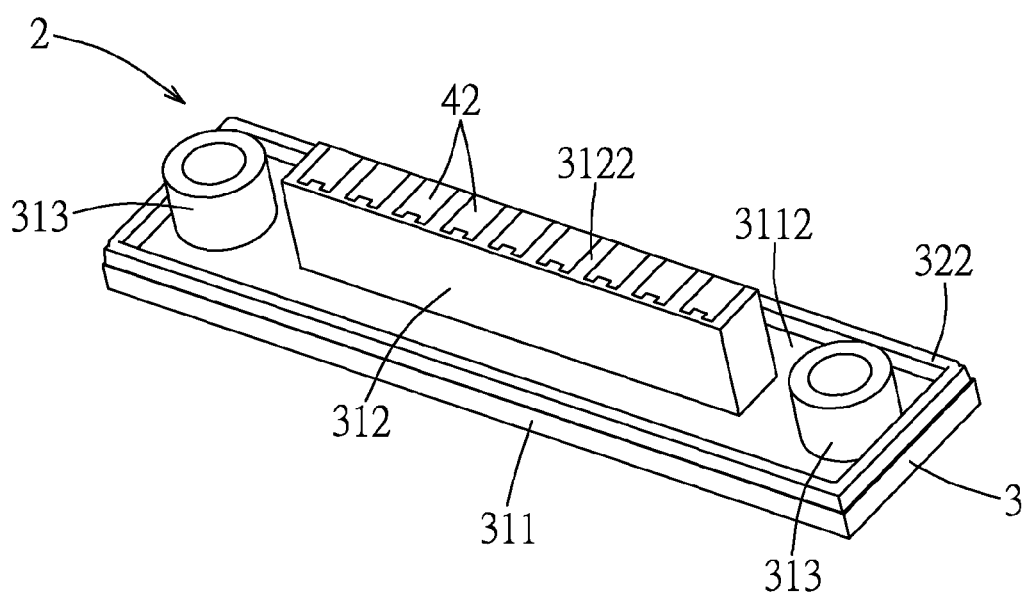
FIG. 3 is a perspective view from another angle of the electrical connector of the embodiment.
Figure 4:
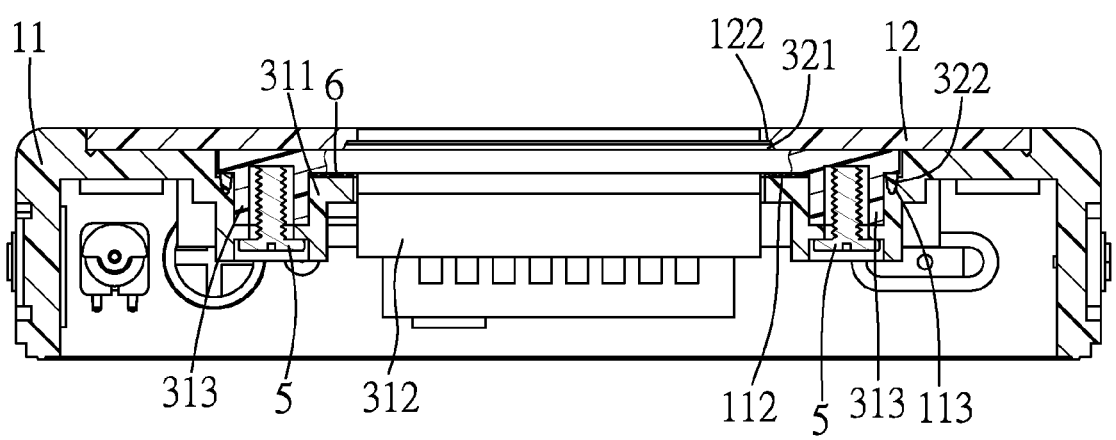
FIG. 4 is a cross-sectional view of the electronic device for illustrating a coupling relationship between a housing of the electronic device and the electrical connector.

Referring to FIGS. 1 to 4, an embodiment of an electronic device 100 according to the present invention includes a housing 1 and an electrical connector 2. The housing 1 includes a main body 11 and a cover 12.

The electrical connector 2 includes an insulation body 3 and a plurality of conductive terminals 4. The insulation body 3 includes a base 31 and a waterproof unit 32. The base 31 includes a board portion 311 and a terminal-holding portion 312 that are formed as one piece. The board portion 311 has a front face 3111 and a rear face 3112. The terminal-holding portion 312 has a first contact face 3121 that is disposed outward of the front face 3111, and a second contact face 3122 that is disposed outward of the rear face 3112. The waterproof unit 32 includes a first sealing portion 321 and a second sealing portion 322 that are made of a resilient material. The first sealing portion 321 protrudes from the front face 3111 and surrounds the terminal-holding portion 312. The second sealing portion 322 protrudes from the rear face 3112 and is disposed along a periphery of the rear face 3112. The base 31 of the insulation body 3 further includes a plurality of fixing portions 313 disposed on the rear face 3112 of the board portion 311. Specifically, each of the fixing portions 313 is in the form of a tube that extends outward of the board portion 311 and that is internally threaded for engagement with a screw fastener 5. In this embodiment, the waterproof unit 32 is made by Thermoplastic Polyurethane (TPU), and the waterproof unit 32 and the base 31 are formed as one piece by co-injection molding.

The conductive terminals 4 are spacedly disposed on the terminal-holding portion 312. Each of the conductive terminals 4 has a first conducting portion 41 that is disposed on the first contact face 3121, and a second conducting portion 42 that is disposed on the second contact face 3122. The first conducting portions 41 are configured to contact with conductive terminals (not shown) of another electrical connector (not shown). The second conducting portions 42 are configured to be connected electrically to a circuit board (not shown) of the electronic device 100. The conductive terminals 4 are fixed to the terminal-holding portion 312 by insert molding.

The main body 11 has a cavity 111 that receives the electrical connector 2 therein, and a carrier face 112 that faces the cover 12 and that supports the board portion 311 of the insulation body 3. The cover 12 covers the cavity 111 and has a window 121 that corresponds to the terminal-holding portion 312 to expose the first contact face 3121 and the first conducting portions 41 of the conductive terminals 4. The cover 12 further has a first surrounding groove 122 that surrounds the window 121, that is disposed immediately adjacent to the window 121, and that receives the first sealing portion 321. The main body 11 further has a second surrounding groove 113 that is disposed on the carrier face 112 and that receives the second sealing portion 322.

To mount the electrical connector 2 on the main body 11, an adhesive layer 6 may be disposed on the rear face 3112 of the board portion 311 to tentatively fix the electrical connector 2 in the cavity 111, and then two screw fasteners 5 are used to respectively engage the fixing portions 313 so as to secure the electrical connector 2 to the main body 11. At this moment, the second sealing portion 322 is received in the second surrounding groove 113. Moreover, the second sealing portion 322 is resilient and thus is capable of being resiliently deformed to abut watertightly against the carrier face 112. In other words, the second sealing portion 322 is tightly sandwiched by the carrier face 112 and the board portion 311 such that passage of liquid or vapor may be prevented. After the electrical connector 2 is secured to the main body 11, the cover 12 may be covered on the main body 11. Meanwhile, the first sealing portion 321 is received in the first surrounding groove 122. Similarly, the first sealing portion 321 is resilient and thus is capable of being resiliently deformed to abut watertightly against an inner side of the cover 12 at a location immediately adjacent to the window 121. In other words, the first sealing portion 321 is tightly sandwiched by the cover 12 and the board portion 311 such that passage of liquid or vapor may be prevented.

The first sealing portion 321, as a first protection, reduces the possibility of passage of liquid or vapor into the housing 1 through a gap between the terminal-holding portion 312 and the cover 12. In addition, the second sealing portion 322, as a second protection, reduces the possibility of liquid and vapor that happens to pass into the cover 12 through the gap between the terminal-holding portion 312 and the cover 12, if any, getting into contact with the circuit board below the electrical connector 2. Therefore, the first and second sealing portions 321, 322, as a whole, achieve superior waterproofing effect. In this embodiment, the fixing portions 313 of the electrical connector 2 are internally threaded for engagement with the screw fasteners 5 to secure the electrical connector 2. However, the fixing portions 313 may as well be snap fasteners in other embodiments of the present invention.

Since the insulation body 3 of the present invention is formed as one piece and incorporates the waterproof unit 32, not only may the additional cost and time for developing a separate waterproof unit be saved, but the assembling time and cost may also be reduced because the waterproof unit 32 is an integral part of the electrical connector 2, which may be easily mounted to the housing 1.

To conclude, by virtue of the waterproof unit 32 integrally formed with the insulation body 3 of the electrical connector 2 of the present invention, the additional cost for developing a separate waterproof unit as well as additional assembling time and cost of the same to the electronic device 100 may be saved. Furthermore, by virtue of the first and second sealing portions 321, 322 of the waterproof unit 32, an exceptional waterproof structure is formed, thus achieving the effect of waterproofing.

While the present invention has been described in connection with what is considered the most practical embodiment, it is understood that this invention is not limited to the disclosed embodiment but is intended to cover various arrangements included within the spirit and scope of the broadest interpretation so as to encompass all such modifications and equivalent arrangements.

What is claimed is:

1. An electronic device comprising:
a housing including a main body and a cover; and
an electric connector including
an insulation body that includes a base and a waterproof unit, said base including a board portion and a terminal-holding portion that are formed as one piece, said board portion including a front face and a rear face, said terminal-holding portion including a first contact face that is disposed outward of said front face and a second contact face that is disposed outward of said rear face, said waterproof unit including a first sealing portion and a second sealing portion that are made of a resilient material, said first sealing portion protruding from said front face and surrounding said terminal-holding portion, said second sealing portion protruding from said rear face and being disposed along a periphery of said rear face, and
a plurality of conductive terminals that are spacedly disposed on said terminal-holding portion, each of said conductive terminals having a first conducting portion that is disposed on said first contact face and a second conducting portion that is disposed on said second contact face;
wherein said main body has a cavity that receives said electrical connector therein, and a carrier face that is disposed in said cavity, that faces said cover and that supports said board portion of said insulation body;
wherein said cover covers said cavity and has a window that corresponds to said terminal-holding portion to expose said first contact face and said first conducting portions of said conductive terminals; and
wherein said first sealing portion abuts watertightly against an inner side of said cover and is immediately adjacent to said window, and said second sealing portion abuts watertightly against said carrier face.

2. The electronic device as claimed in claim 1, wherein said cover further has a first surrounding groove that surrounds said window, that is immediately adjacent to said window and that receives said first sealing portion, and said main body further has a second surrounding groove that is disposed on said carrier face and that receives said second sealing portion.

3. The electronic device as claimed in claim 2, wherein said base of said insulation body further includes a plurality of fixing portions that are disposed on said rear face of said board portion and that are secured to said main body.

4. The electronic device as claimed in claim 3, wherein each of said fixing portions is in the form of a tube that extends outward of said board portion and that is internally threaded for engagement with a screw fastener.

5. The electronic device as claimed in claim 1, wherein said waterproof unit and said base are formed as one piece by co-injection molding.

6. The electronic device as claimed in claim 5, wherein said conductive terminals are secured to said terminal-holding portion by insert molding.

\* \* \* \* \*